United States Patent
Lai et al.

(10) Patent No.: US 7,840,865 B2
(45) Date of Patent: Nov. 23, 2010

(54) BUILT-IN SELF-TEST OF INTEGRATED CIRCUITS USING SELECTABLE WEIGHTING OF TEST PATTERNS

(75) Inventors: Liyang Lai, Wilsonville, OR (US); Wu-Tung Cheng, Lake Oswego, OR (US); Thomas Hans Rinderknecht, Tualatin, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 373 days.

(21) Appl. No.: 11/973,084

(22) Filed: Oct. 5, 2007

(65) Prior Publication Data

US 2008/0235544 A1    Sep. 25, 2008

Related U.S. Application Data

(60) Provisional application No. 60/919,662, filed on Mar. 23, 2007.

(51) Int. Cl.
*G01R 31/28* (2006.01)

(52) U.S. Cl. .................................. 714/728; 714/733

(58) Field of Classification Search .............. 714/728, 714/733
See application file for complete search history.

(56) References Cited

U.S. PATENT DOCUMENTS

| | | | |
|---|---|---|---|
| 5,612,963 A * | 3/1997 | Koenemann et al. | 714/739 |
| 5,737,340 A | 4/1998 | Tamarapalli et al. | |
| 5,983,380 A * | 11/1999 | Motika et al. | 714/733 |
| 6,041,429 A * | 3/2000 | Koenemann | 714/738 |
| 6,295,315 B1 | 9/2001 | Frisch et al. | |
| 6,456,961 B1 | 9/2002 | Patil et al. | |
| 6,658,616 B1 | 12/2003 | Chang et al. | |
| 6,662,327 B1 | 12/2003 | Rajski | |
| 6,671,838 B1 * | 12/2003 | Koprowski et al. | 714/726 |
| 6,795,948 B2 * | 9/2004 | Lin et al. | 716/1 |
| 6,829,728 B2 | 12/2004 | Cheng et al. | |
| 6,886,124 B2 | 4/2005 | Wang | |
| 6,920,597 B2 | 7/2005 | Rinderknecht et al. | |
| 6,934,897 B2 | 8/2005 | Mukherjee et al. | |
| 7,036,064 B1 | 4/2006 | Kebichi et al. | |
| 7,117,415 B2 * | 10/2006 | Forlenza et al. | 714/733 |

(Continued)

OTHER PUBLICATIONS

Abramovici et al., "Digital Systems Testing and Testable Design," New York, IEEE Press, pp. 457-477, 1990.

(Continued)

*Primary Examiner*—James C Kerveros
(74) *Attorney, Agent, or Firm*—Klarquist Sparkman, LLP

(57) ABSTRACT

A built-in self-test (BIST) circuit is disclosed that allows high fault coverage. Additionally, a method is disclosed for implementing the BIST circuit. In one aspect, the BIST circuit includes a plurality of scan chains that receive test patterns used in testing the integrated circuit. A pseudo random pattern generator provides test patterns to the scan chains. Weight select logic is positioned between the scan chains and the pseudo random pattern generator and controls the weightings of the test patterns that are loaded in the scan chains. In another aspect, the weight select logic can switch the weightings of the test patterns on a per-scan-cell basis. Thus, as the scan chains are loading, the weight select logic can effectively switch between test patterns being loaded into the scan chains.

23 Claims, 12 Drawing Sheets

U.S. PATENT DOCUMENTS

| | | | |
|---|---|---|---|
| 7,200,286 B2 | 4/2007 | Matsumoto | |
| 7,225,376 B2* | 5/2007 | Appinger et al. | 714/738 |
| 7,239,978 B2 | 7/2007 | Cheng et al. | |
| 7,284,176 B2* | 10/2007 | Wang et al. | 714/738 |
| 7,296,249 B2 | 11/2007 | Rinderknecht et al. | |
| 7,555,688 B2* | 6/2009 | Alvamani et al. | 714/729 |
| 2002/0059543 A1 | 5/2002 | Cheng et al. | |
| 2002/0106014 A1 | 8/2002 | Frisch et al. | |
| 2003/0115525 A1 | 6/2003 | Hill et al. | |
| 2003/0191996 A1 | 10/2003 | Mukherjee et al. | |
| 2004/0025096 A1 | 2/2004 | Rinderknecht et al. | |
| 2004/0190331 A1 | 9/2004 | Ross et al. | |
| 2004/0210803 A1 | 10/2004 | Cheng et al. | |
| 2005/0066247 A1 | 3/2005 | Cheng et al. | |
| 2005/0081130 A1 | 4/2005 | Rinderknecht et al. | |
| 2005/0222816 A1 | 10/2005 | Cheng et al. | |
| 2006/0111873 A1 | 5/2006 | Huang et al. | |
| 2006/0146622 A1 | 7/2006 | Mukherjee et al. | |
| 2006/0156133 A1 | 7/2006 | Mukherjee et al. | |
| 2006/0156134 A1 | 7/2006 | Mukherjee et al. | |
| 2006/0156144 A1 | 7/2006 | Cheng et al. | |
| 2006/0190789 A1 | 8/2006 | Kebichi et al. | |
| 2007/0011530 A1 | 1/2007 | Rajski et al. | |
| 2007/0011542 A1 | 1/2007 | Mukherjee et al. | |
| 2007/0100586 A1 | 5/2007 | Cheng et al. | |
| 2007/0220381 A1 | 9/2007 | Huang et al. | |
| 2007/0226570 A1 | 9/2007 | Zou et al. | |
| 2007/0234157 A1 | 10/2007 | Rajski et al. | |

OTHER PUBLICATIONS

Bardell et al., "Built-In test for VLSI: Pseudorandom Techniques," New York, John Wiley & Sons, pp. 61-88, 124-127, 217-225, 1987.

Brglez et al., "Hardware-Based Weighed Random Pattern Generation for Boundary Scan," Proceedings of International Test Conference, pp. 264-274, 1989.

Cheng, et al., "Timing-Driven Test Point Insertion for Full-Scan and Partial-Scan BIST," Proceedings of International Test Conference, pp. 506-514, 1995.

Hamzaoglu et al., "Reducing Test Application Time for Built-In Self Test Pattern Generators," Proceedings of VLSI Test Symposium, pp. 369-375, 2000.

Hellebrand et al., "Built-In Test for Circuits with Scan Based on Resending of Multiple Polynomial Linear Feedback Shift Registers," IEEE Transactions on Computers, vol. C-44, pp. 223-233, Feb. 1995.

Jas et al., "Virtual Scan Chains: A Means for Reducing Scan Length in Cores," Proceedings of VLSI Test Symposium, pp. 73-78, 2000.

Konemann, "LFSR-Coded Test Patterns for Scan Designs," Proceedings of European Test Conference, pp. 237-242, 1991.

Kusko et al., "99% AC Test Coverage Using Only LBIST on the 1 GHz IBM S390 zSeries 900 Microprocessor," Proceedings of International Test Conference, pp. 586-592, 2001.

Lai et al., "Hardware Efficient LBIST with Complementary Weights," Proceedings of ICCD, pp. 479-481, 2005.

Lai et al., "Programmable Scan-Based Logic Built-In Self Test," pp. 371-377, 16th Asian Test Symposium (ATS 2007), 2007.

Mitra et al., "X-Compact: An Efficient Response Compaction Technique for Test Cost Reduction," Proceedings of International Test Conference, pp. 311-320, 2002.

Muradali, et al., "A New Procedure for Weighted Random Built-In Self Test," Proceedings of International Test Conference, pp. 660-669, 1990.

Patel et al., "Application of Saluja-Karpovsky Compactors to Test Responses with Many Unknowns," Proceedings of VLSI Test Symposium, pp. 107-112, 2003.

Pomeranz et al., "3-Weighted Pseudorandom Test Generation Based on Deterministic Test Set for Combinatorial and Sequential Circuits," IEEE Transactions on CAD of Integrated Circuits and Systems, vol. 12, No. 7, pp. 1050-1058, 1993.

Rajski et al., "Convolutional Compaction of Test Responses," Proceedings of International Test Conference, pp. 745-754, 2003.

Rajski et al., "Embedded Deterministic Test for Low-Cost Manufacturing Test," Proceedings of International Test Conference, pp. 301-310, 2002.

Rajski et al., "Embedded Deterministic Test", IEEE Transactions on Computer-Aided Design of Integrated Circuits and Systems, vol. 23, Issue 5, pp. 776-792, May, 2004.

Rudnick et al., "An Observability Enhancement Approach for Improved Testability and At-Speed Test," IEEE Transactions on CAD, vol. 13, No. 8, pp. 1051-1056, 1994.

Savaria et al., "Automatic Test Point Insertion for Pseudorandom Testing," Proceedings of International Symposium on Circuit and Systems, pp. 1960-1963, 1991.

Schnurmann et al., "The Weighted Random Test Pattern Generation," IEEE Transactions on Computers, vol. C-24, pp. 695-700, Jul. 1975.

Tamarapalli et al., "Constructive Multi-Phase Test Point Insertion for Scan-Based BIST," Proceedings of International Test Conference, pp. 649-658, 1996.

Touba et al, "Test-Point Insertion Based on Path Tracing," Proceedings of VLSI Test Symposium, pp. 2-8, 1996.

Tsai et al., "Star Test: The Theory and its Applications," IEEE Transactions on Computer Aided Design of Integrated Circuits and Systems, vol. 19, No. 9, pp. 1052-1064, 2000.

Waicukauski, et al., "A Method for Generating Weighted Random Patterns," IBM Journal of Research and Development, vol. 33 No. 2, pp. 149-161, Mar. 1989.

Wunderlich, "Multiple Distributions for Biased Random Test Patterns," Proceedings of International Test Conference, pp. 236-244, 1988.

Wunderlich, "Self Test Using Unequiprobable Random Patterns," Proceedings of International Symposium on Fault-Tolerant Computing, pp. 258-263, 1987.

\* cited by examiner

BUILT-IN SELF-TEST OF INTEGRATED CIRCUITS USING SELECTABLE WEIGHTING OF TEST PATTERNS

CROSS REFERENCE TO RELATED APPLICATION

This application claims the benefit of U.S. Provisional Application No. 60/919,662, filed Mar. 23, 2007, which is hereby incorporated by reference.

TECHNICAL FIELD

This invention relates generally to the testing of circuits for faults. More particularly, the invention relates to a method and apparatus for dynamically selecting weights of test patterns used in a built-in self-test environment.

BACKGROUND

The very large scale integrated (VLSI) circuits fabricated today typically contain hundreds of thousands of circuit elements. Testing these complex circuits to isolate faulty circuits from fault-free circuits has become increasingly difficult because of the inaccessibility of internal circuit elements and the elements' interdependencies. Furthermore, as the number of possible test paths through a circuit rises at $2^n$, where n is the number of circuit elements, efficient testing will continue to increase in difficulty as the density of these circuits continues to grow.

To test a circuit, a set of test vectors, or patterns, must be developed. The circuit is simulated without faults and the test patterns are applied to determine the circuit's expected response to the patterns at its primary outputs. The circuit is then simulated with faults and the test patterns are again applied to determine if there is a change in the expected response to any pattern at the outputs. A fault that does not cause a change in the expected (fault free) response is an undetected fault. A test procedure desirably detects a high percentage of faults, and thus should have a minimum of undetected faults.

One common method of developing tests employs external automated test equipment (ATE). In this method, an automatic test pattern generator (ATPG) is used which, given a circuit and fault model, generates a set of test patterns designed to detect close to 100% of the circuit's faults. These deterministic test patterns are then compressed and stored in a tester. During testing, they are decompressed and loaded into the primary inputs of the circuit under test (CUT). Faults are detected by comparing the response of the circuit to the expected response.

An example of an ATE environment is described in U.S. Patent Application Publication No. 2007/0011530-A1, which is hereby incorporated by reference. Such publication describes that an external ATE supplies compressed test patterns on scan channels to the integrated circuit under test. These test patterns are then decompressed and provided to scan chains to test the integrated circuit. Specific examples of decompressors and compactors are provided.

Although deterministic ATPG can detect close to 100% of faults, it requires enormous resources to generate and store the test patterns required for complex VLSI circuits. Furthermore, interactions between the external tester and elements in the CUT create their own set of potential errors.

To counter these problems, built-in self-test (BIST) methods have been developed that move the test pattern generation and output response analysis from an external source onto the chip itself. For certain BIST technologies, rather than using a set of test patterns specifically defined to detect a known set of faults, a pseudo-random pattern generator (PRPG), generally a linear feedback shift register (LFSR), on the chip itself generates pseudo-random patterns, which are then used to detect faults. Typically, the LFSR includes interconnected memory elements (such as flip-flops) and linear logic elements (such as XOR or XNOR gates). On-chip output response analysis is typically performed by a multiple-input-shift-register (MISR) or other circuit that compacts the output response and generates a signature for comparison with the signature of a fault-free circuit.

Although pseudo-random pattern generation is simple, this method rarely achieves the close-to 100% fault detection achieved by ATPG, as there are almost always faults that require very specific patterns to test; these patterns often take many, many cycles to be automatically generated, thereby elevating the cost of test application and fault simulation beyond acceptable levels.

To tackle the problem of pseudo-random-pattern resistance, many techniques have been proposed, such as changing the attributes of the pseudo-random patterns to provide better fault coverage. Some of these techniques include reseeding, weighted random testing, and pattern mapping. In reseeding, deterministic test patterns are compressed and encoded as seeds for a PRPG. These seeds then generate test patterns known to find otherwise-undetectable faults. Weighted random testing uses mathematical methods to modify the pseudo-random patterns in ways that bias them toward detecting random-pattern-resistant faults by assigning weights to the values contained in specific scan cells, biasing their values towards "1" or "0". Pattern mapping takes the set of patterns generated by the PRPG and transforms them, using on-chip logic, into a new set of deterministic patterns that provides the desired fault coverage. However, these methods are significantly more complicated than simple random pattern generation and either require extra memory to store the seeds or weight sets, or require additional logic, all of which is expensive in terms of area overhead.

Accordingly, there is still a need for a BIST solution that provides high fault coverage without unduly expensive logic overhead.

SUMMARY

A built-in self-test (BIST) circuit is disclosed that allows high fault coverage using little hardware. Additionally, a method is disclosed for implementing the BIST circuit.

In one embodiment, the BIST circuit includes a plurality of scan chains that receive test patterns used in testing the integrated circuit. A pseudo random pattern generator provides test patterns of different weights to the scan chains. Weight select logic is positioned between the scan chains and the pseudo random pattern generator and controls the weightings of the test patterns that are loaded in the scan chains.

In some embodiments, the weight select logic can switch the weightings of the test patterns on a per-scan-cell basis. Thus, as the scan chains are loading, the weight select logic can dynamically switch between candidate pseudo-random test patterns that have different weights associated with each scan chain. The selection occurs on a per-cycle basis. In one embodiment, two candidate test patterns are used and a single control bit per scan chain implements the selection functionality. The candidate pseudo-random patterns can be created by applying different weighting logic at the outputs of a shared LFSR and phase shifter (or other suitable automaton).

In certain embodiments, the weight select logic uses a decompressor capable of obtaining high fault coverage by using features of an embedded deterministic test decompressor. However, instead of using external inputs to feed the decompressor, at least one shift register is used with a predetermined seed value to feed the decompressor.

In yet another embodiment, a method of determining the seed value used in the shift register is disclosed. The method computes an optimal seed value so that the fault coverage is maximized.

Certain embodiments build on the EDT concept of using a decompressor to take the compressed pattern and translate that into fixed bit assignments on the desired scan cells, and random assignments on the remaining scan cells. Thus, the embodiments leverage the existing EDT technology to provide a fixed weight at particular scan cells (e.g., a complementary weight pair, an arbitrary pair, or select from more than two weights), and random weight assignment at the remaining cells.

Any of the disclosed embodiments can be performed in a variety of environments, including a simulation environment. Further, any of the disclosed methods can be implemented as computer-readable media comprising computer-executable instructions for causing a computer to perform the methods. Any of the disclosed methods implemented in a computer environment can also be performed by a single computer or via a network. Further, computer-readable media storing test patterns or test pattern values (or any other final or intermediate results) produced by any of the disclosed methods are also disclosed. Additionally, any of the disclosed apparatus can be described or represented as design data or design information stored on one or more computer-readable media.

These and other aspects and features of the invention will become apparent from the following detailed description of an exemplary embodiment which makes reference to the accompanying drawings.

DETAILED DESCRIPTION

Figure 1:
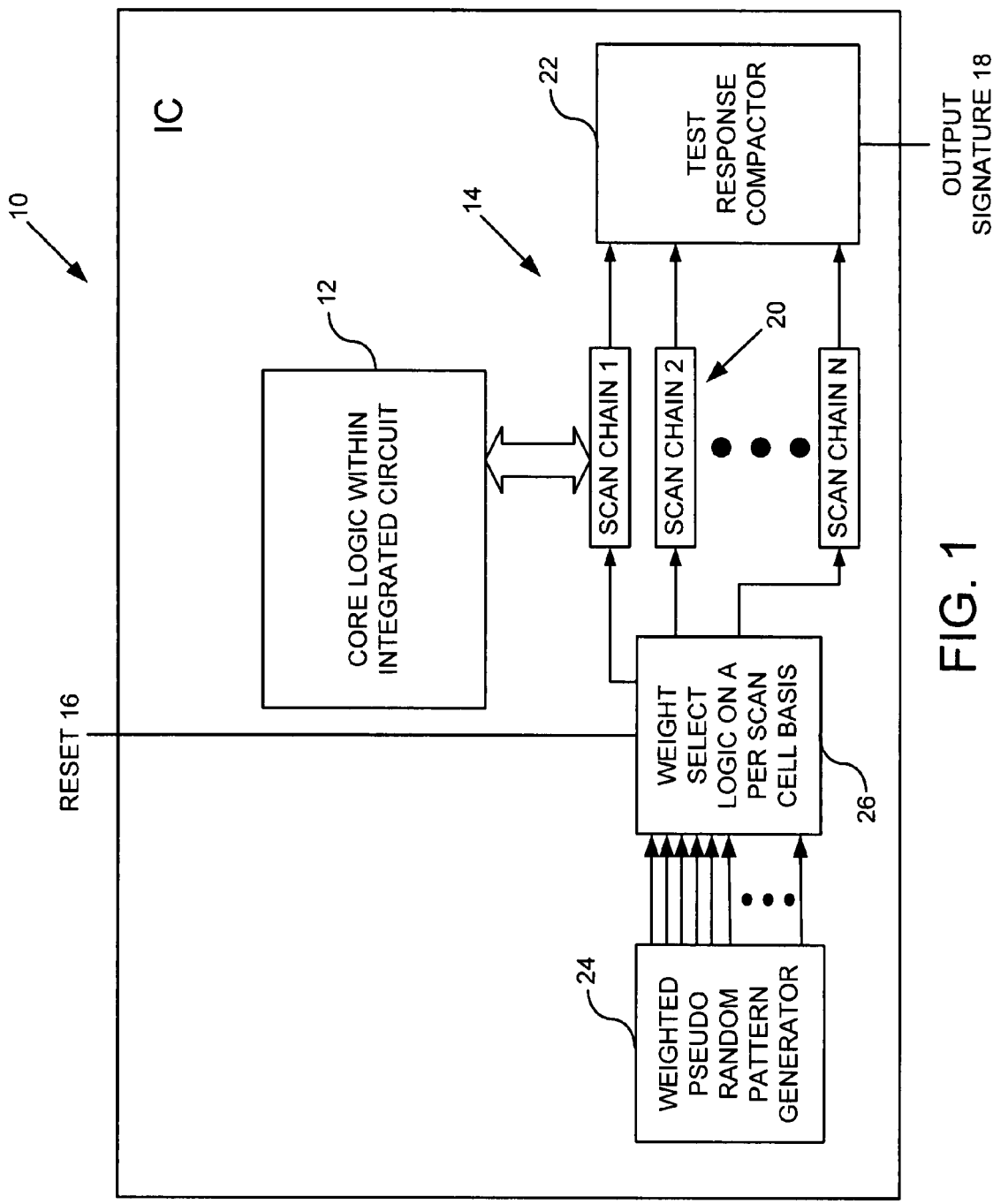
FIG. 1 is a block diagram of an integrated circuit, including built-in self-test (BIST) circuitry to test core logic within the integrated circuit.

Disclosed below are representative embodiments of electronic circuit testing techniques and associated apparatus that should not be construed as limiting in any way. Instead, the present disclosure is directed toward all novel and nonobvious features and aspects of the various disclosed methods, apparatus, and equivalents thereof, alone and in various combinations and subcombinations with one another. The disclosed technology is not limited to any specific aspect or feature, or combination thereof, nor do the disclosed methods and apparatus require that any one or more specific advantages be present or problems be solved.

As used in this application and in the claims, the singular forms "a," "an" and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements.

Although the operations of some of the disclosed methods and apparatus are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods and apparatus can be used in conjunction with other methods and apparatus.

The disclosed embodiments can be implemented in a wide variety of integrated circuits that utilize scan-based or partially scan-based testing (for example, application-specific integrated circuits (ASICs) (including mixed-signals ASICs), systems-on-a-chip (SoCs), or programmable logic devices (PLDS) such as field programmable gate arrays (FPGAs)). Such integrated circuits can be used in a vast assortment of electronic devices, ranging from portable electronics (such as cell phones, media players, and the like) to larger-scale items (such as computers, control systems, airplanes, automobiles, and the like). All such items comprising integrated circuits with embodiments of the disclosed technology or equivalents are considered to be within the scope of this disclosure.

Any of the apparatus described herein can be designed, verified, and/or simulated using software that comprises computer-executable instructions stored on one or more computer-readable media. Such software can comprise, for example, an electronic design automation (EDA) software tool, such as a design, verification, or simulation tool. Similarly, any of the methods described herein can be performed or simulated (at least in part) using software comprising computer-executable instructions stored on one or more computer-readable media. Furthermore, any intermediate or final results of the disclosed methods can be stored on one or more computer-readable media. For example, a software tool can be used to determine and store one or more control signals used to control any of the disclosed apparatus. Any such software can be executed on a single computer or on a networked computer (for example, via the Internet, a wide-area network, a local-area network, a client-server network, or other such network). For clarity, only certain selected aspects of the software-based implementations are described. Other details that are well known in the art are omitted. For the same reason, computer hardware is not described in further detail. It should be understood that the disclosed technology is not limited to any specific computer language, program, or computer. For instance, a wide variety of commercially available computer languages, programs, and computers can be used.

Further, any of the disclosed apparatus can be stored as circuit design information on one or more computer-readable media. For example, one or more data structures containing design information (for example, a netlist, HDL file, or GDSII file) can be created (or updated) and stored to include design information for any of the disclosed apparatus. Such data structures can be created (or updated) and stored at a local computer or over a network (for example, by a server computer).

Moreover, any of the disclosed methods can be used or otherwise analyzed using representations of circuits, which are stored on one or more computer-readable media. For presentation purposes, however, the present disclosure sometimes refers to a circuit or its circuit components by their physical counterpart (for example, scan cells, spatial compactors, registers, selection logic, logic gates, and other such terms). It should be understood, however, that any reference in the disclosure or the claims to a physical component includes representations of such circuit components as are used in simulation, ATPG, or other such EDA environments.

The present description relates to built-in self-test (BIST), which is a testing mechanism that reduces the complexity and thereby decreases the cost and reduces reliance upon external test equipment. BIST reduces costs in two ways: first, it reduces the test cycle duration, and second, it reduces the complexity of the test/probe setup by reducing the number of I/O signals that must be driven or examined under test or control. This leads in a reduction in hourly charges for automated test equipment (ATE) services.

A BIST circuit does not require externally-supplied test patterns, but rather uses a reset signal (or other minimally-supplied external signal lines). The testing circuitry can initiate the testing sequence and provide an output signature indicating whether the test passed or failed. FIG. 1 shows a generic integrated circuit (IC) 10 that may be a programmable-type circuit, such as an FPGA or any type of analog, digital, or mixed-signal circuit. In any event, the IC 10 includes core logic 12 that implements the standard functionality of the IC. BIST circuitry 14 is used to test the functionality of the core logic 12 in response to a reset signal 16 provided on an external pin of the IC 10 and provides an output signature 18 indicating whether the IC passed or failed the test.

The BIST circuitry 14 includes a number of scan chains 20 coupled in parallel and labeled 1 to N (where N may be any desired number). Scan chains are well-known in the art and are designed to receive test patterns that are used to test different points within the core logic 12 of the integrated circuit 10. The scan chains 20 include a series of scan cells (not shown), wherein each scan cell holds one bit of test data. Once the scan chains receive the responses from the test, such responses are shifted into a test response compactor 22 that provides the output signature 18. The test response compactor 22 can be a wide variety of compactors and take a variety of forms, but a typical compactor used is a MISR-type compactor. The test patterns are weighted patterns provided by a weighted pseudo random pattern generator 24. The pseudo random pattern generator may take a variety of forms, such as a linear feedback shift register, a ring generator, or cellular automaton.

In BIST circuitry, it is desirable to provide pseudo random patterns into the scan chains in order to optimize fault coverage. The pseudo random patterns have particular "weights" associated therewith that relate to the probability of the pattern being a certain value. For example, a pseudo random pattern having a weight of ⅞, outputs a series of numbers and each number has a ⅞ possibility of being a 1, and a ⅛ possibility of being a 0. Typically, the weighted pseudo random pattern generator 24 includes one output per scan chain and provides a sequence of numbers on each output that represents a test pattern to be loaded into a scan chain. However, as described herein, it is possible to have more than one test pattern associated with each scan chain. The outputs of the weighted pseudo random pattern generator 24 are input to a weight select logic 26 that is coupled to the reset signal 16. As described further below, the weight select logic 26 dynamically controls the particular weighting of the test pattern that is ultimately provided to the scan chains 20. For example, the weight select logic 26 dynamically controls the actual test pattern loaded in the scan chains by allowing the candidate test pattern from the weighted pseudo random pattern generator 24 to pass directly to the scan chains 20 or by modifying the candidate test pattern received from the pseudo random pattern generator before inputting such modified test pattern into the scan chains 20. A simple example of such a modification performed by the weight select logic is that the test pattern may be inverted to a complementary test pattern. In another embodiment, there are multiple candidate test patterns and an output of a decompressor takes a compressed pattern and translates it into fixed weight assignments on desired scan cells, while the remaining cells receive random weight assignments.

Additionally, the weight select logic 26 is capable of switching the weight of the test pattern provided to the scan chains on a per-scan-cell basis. Thus, while a scan chain 20 is loading, the weight select logic 26 may dynamically switch to a test pattern of different weighting. Such dynamic switching may result in each scan cell within the scan chain having a different test pattern weighting than neighboring scan cells. The ability to switch between different weighted test patterns increases the fault coverage in the BIST circuitry.

Figure 2:
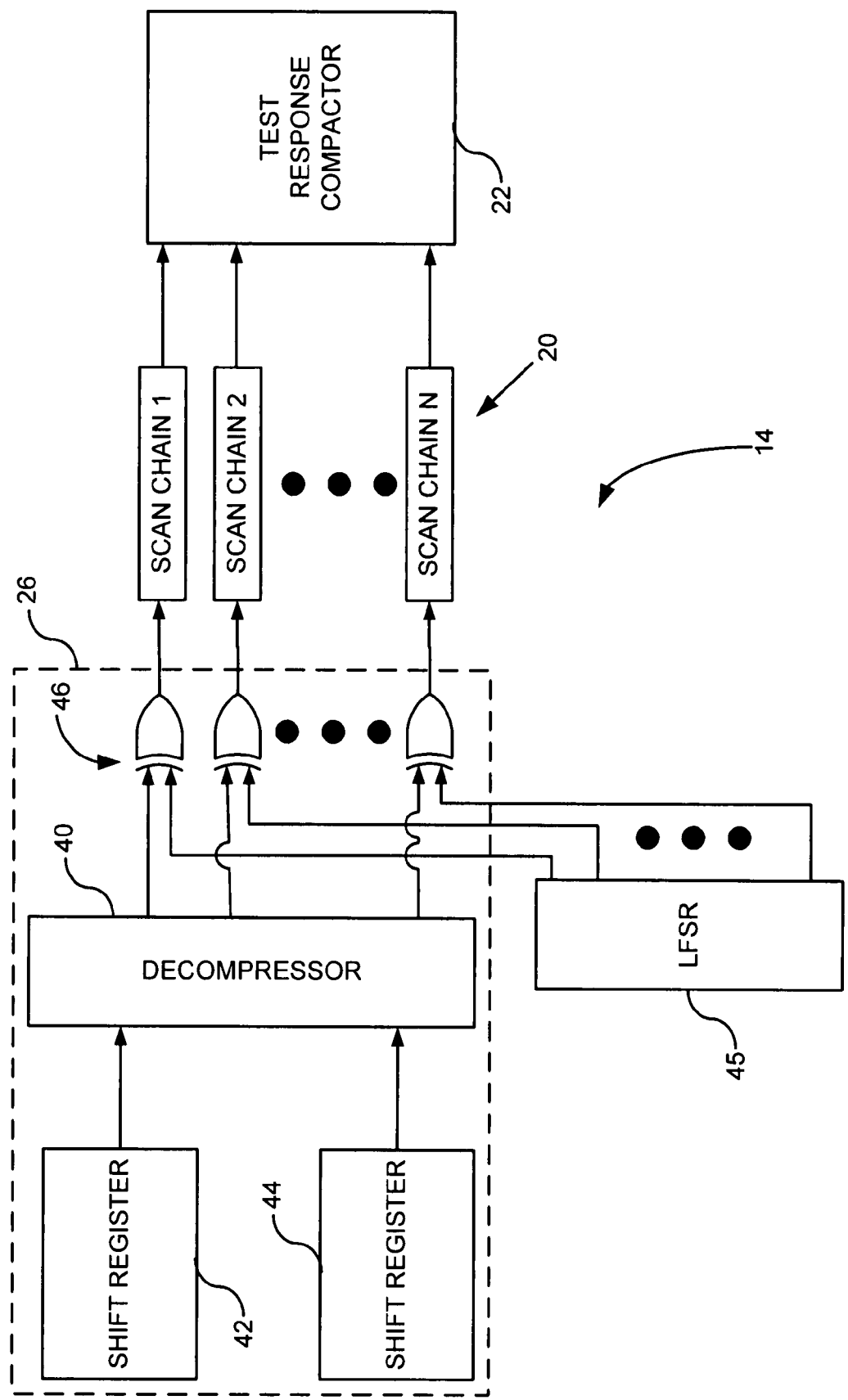
FIG. 2 is a first embodiment of a BIST circuit for dynamically selecting weighting of test patterns provided to scan chains.

FIG. 2 shows an example of the BIST circuitry 14 of FIG. 1. In this example, the weighted pseudo random pattern generator is a linear feedback shift register (LFSR) 45 that generates pseudo random patterns in a well-known manner. The LFSR 45 provides pseudo random patterns in a one-to-one correspondence with the scan chains 20. The weight select logic 26 includes a decompressor 40 that receives inputs from shift registers 42, 44 coupled in parallel to the decompressor. The decompressor 40 generates deterministic patterns on its outputs based on the inputs received from the shift registers 42, 44. The output of the decompressor 40 is then passed to combinational logic that includes a bank of Exclusive OR gates 46 (XOR). Each Exclusive OR gate has one input coupled to the LFSR 45 and a second input coupled to the decompressor 40. The Exclusive OR gates 46 function to either pass the pseudo random patterns generated from the LFSR 45 directly to the scan chains 20 or invert the test pattern provided to the scan chains, depending on the value input from the decompressor 40. Thus, the decompressor 40 controls the weightings of the test patterns by dynamically switching between either the pseudo random pattern itself or the complement thereof. Additionally, each bit to be loaded in the scan cells is fed through combinational logic 46 and, consequently, the decompressor 40 controls the weighting of the pseudo random patterns provided to the scan chains 20 on a per-scan-cell basis.

Figure 3:
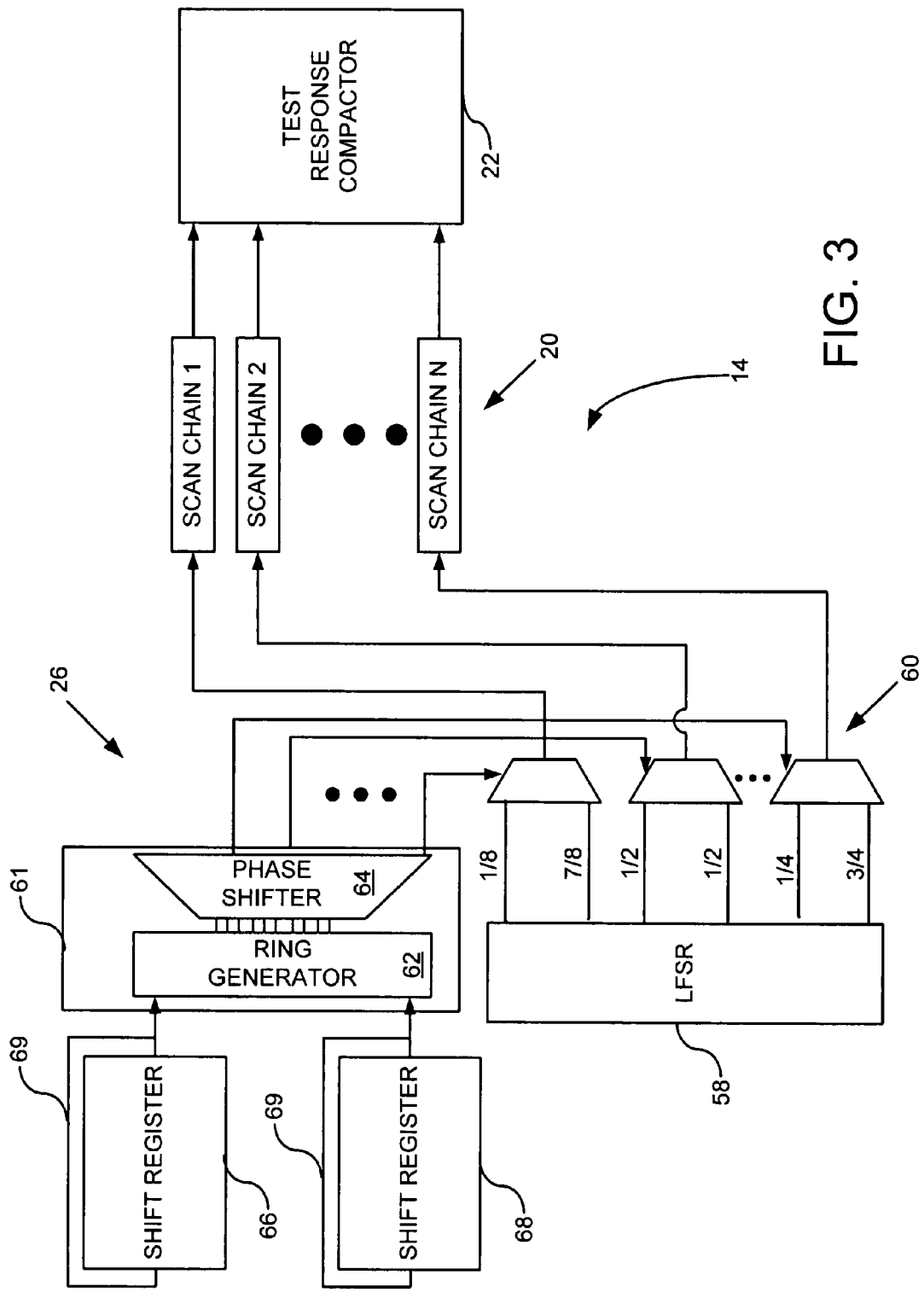
FIG. 3 is another embodiment of a BIST circuit that may be used for dynamically selecting the weight of test patterns provided to scan chains.

FIG. 3 shows another embodiment of the BIST circuit 14. In this example, the weighted pseudo random pattern generator is an LFSR 58 with two outputs per scan chain. The weighted pseudo random test patterns from the LFSR 58 are input into combinational logic that includes a bank of multiplexers 60. The output of the multiplexers 60 are coupled to the scan chains 20. The control for the multiplexers 60 is provided by a decompressor 61. Thus, the decompressor 61 controls the weighting of test patterns to the scan chains by selecting which of the pseudo random test patterns are provided to each scan chain. In some embodiments, it is desirable to have complementary weighted patterns input into the multiplexer 60 so that the decompressor 61 can dynamically select between the pseudo random pattern or the complement (i.e., inverted version) thereof. Any desired weightings can be used (e.g., ⅛ and ⅞; ½ and ½; ¼ and ¾). Although not shown, instead of the LFSR 58 generating both the pseudo random pattern and its complement, the LFSR may generate only one pseudo random pattern that is separately inverted. Both the inverted and non-inverted forms are then supplied to the multiplexers 60.

Further details of the decompressor 61 are shown in FIG. 3 as including a ring generator 62 and a phase shifter 64. Two shift registers 66, 68 are coupled in parallel to the ring generator 62. The shift registers are configured to be re-circulating as shown by feedback lines 69. It is preferable that the length of the re-circulating shift register matches the number of scan cells in the longest scan chain. The output of the ring generator 62 is supplied to the phase shifter 64 that allows for expanded test pattern fault coverage for testing the integrated circuit. Specific examples of a ring generator and phase shifter that can be used in any of the embodiments described herein are provided in U.S. Patent Application Publication No. 2007/0011530-A1, which are incorporated by reference. Other examples of EDT decompressors and exemplary EDT environments that are suitable for use with the disclosed technology are described in, for example, U.S. Pat. Nos. 6,327,687; 6,353,842; 6,557,129; 6,684,358; 6,874,109; and U.S. Patent Application Publication No. 2003/0120988, all of which are hereby incorporated herein by reference. Any desired type of decompressor may be used, as there are many different types of decompressors currently known in the art. For example, the decompressor 61 may include a linear feedback shift register and a shadow register. By providing input channels from the shift register 66, 68, the decompressor looks very similar to an embedded deterministic test decompressor having multiple input channels provided from an ATE. However, in this example the current embodiments are BIST solutions that do not rely on externally-provided signals outside of the integrated circuit, although some minimal signals may be used, such as a reset signal.

FIGS. 2 and 3 illustrate that there are different techniques that may be used for the decompressor to control the weightings of test patterns that are ultimately loaded into scan chains for testing. Additional techniques may also be used, such as using Exclusive NOR gates or other combinational logic that provides the same functionality.

Figure 4:
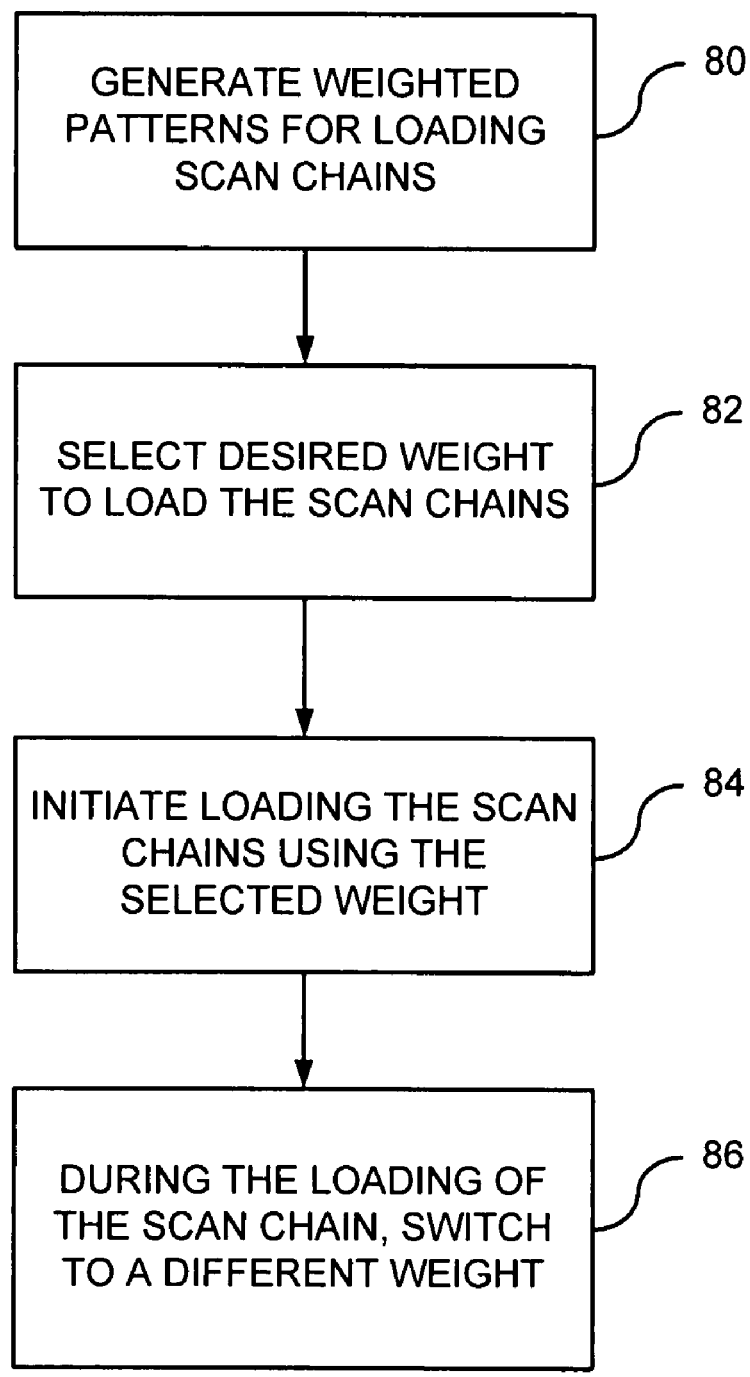
FIG. 4 is a flowchart of a method for implementing the BIST circuit.

FIG. 4 is a flowchart of a method for implementing the circuits herein described. In process block 80, weighted patterns are generated to load into the scan chains for testing the core logic 12. As previously described, this may be accomplished using any desired pseudo random pattern generator, such as an LFSR. In process block 82, the desired weight of the test pattern is selected and passed to the scan chains through the control of the decompressor (e.g., decompressor 40 or 61) that may either directly select between different test patterns, or that may invert the test pattern to change the weighting. Other control mechanisms may also be used. For example, the decompressor can select between three or more different weighting options. In process block 84, the selected test pattern is used to initiate loading of the scan chains. In process block 86, the currently-used test pattern is dynamically switched to a second test pattern having a different weight than the first test pattern. Such switching may occur after the loading of every scan cell, as the decompressor can select a different test pattern on every clock cycle. For example, in FIG. 2, if the decompressor 40 outputs a logic high-level signal to the Exclusive OR gates (FIG. 2), then the test pattern supplied by the LFSR 45 is inverted before being loaded in the scan chains. On the next clock signal the decompressor 40 can switch back to a logic low-level signal so that the test pattern supplied by the LFSR is non-inverted.

Figure 5:
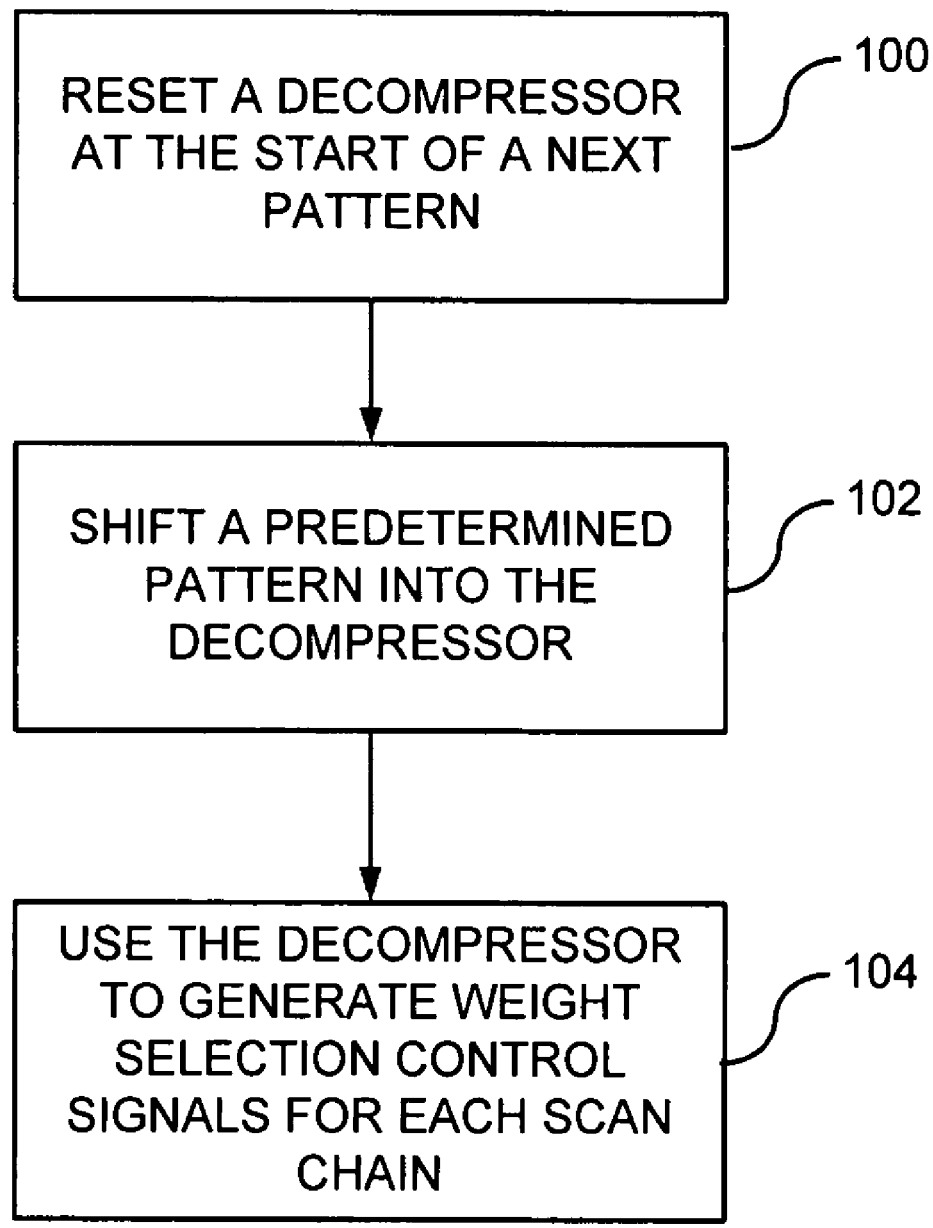
FIG. 5 provides further details of the method of FIG. 4.

FIG. 5 shows further details of process block 82 of FIG. 4. In particular, in process block 100, a reset signal is used to restart the decompressor (e.g., decompressor 40, 61) at the start of each pattern. The shift register (e.g., shift registers 42, 44, 66, and/or 68) is also initialized by the reset signal 16 (FIG. 1), which causes an initial seed pattern to be loaded in the shift register from a parallel register (not shown). The shift register may be initialized using other techniques well-known in the art. In process block 102, the shift register begins to shift on every clock cycle providing input data to the decompressor 40, 61 in a manner similar to embedded-deterministic-test-type decompressors. The seed value used in the shift registers (e.g., shift registers 42, 44, 66, 68) is such to provide the desired fault coverage in testing the core logic within the integrated circuit 12. In process block 104, the output of the decompressor is used to provide control signals that select the desired weight to load into the scan chains.

Figure 6:
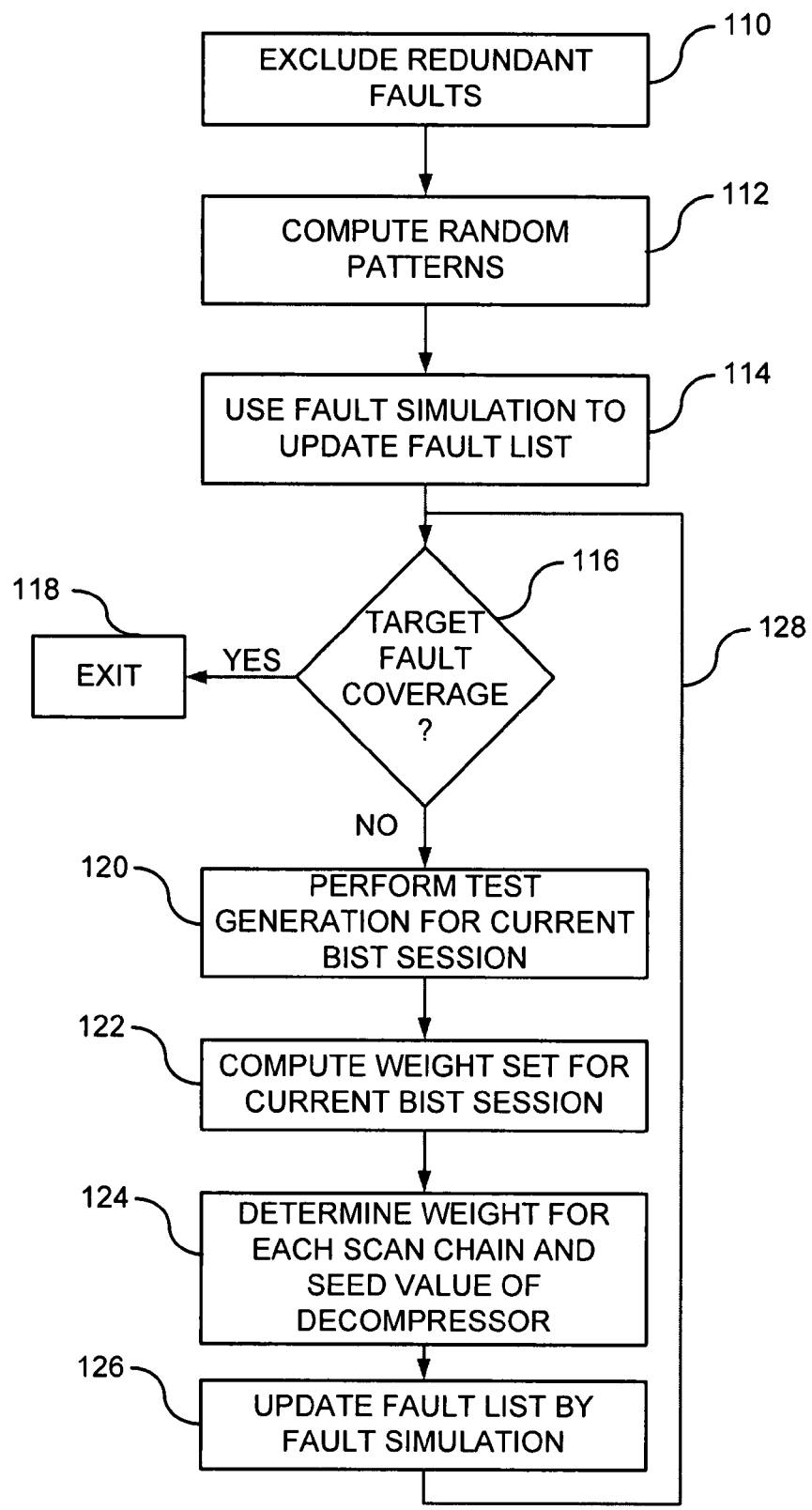
FIG. 6 is a flowchart of a method for determining the values stored in the BIST circuit for each test session.

FIG. 6 illustrates one exemplary manner of generating control data for the BIST circuit. The illustrated BIST technique uses a combination of random patterns and weighted patterns with complementary weights. The desire is to determine the value of the registers (the control data) for each BIST session. A BIST session is a sequence of BIST patterns that are applied using the same weight selection for the scan chains in the candidate test patterns, and the same control value for the selection logic. Complete testing of the circuit under test typically includes several BIST sessions. Each BIST session is tuned to target a different set of pseudo-random pattern resistant faults within the design. Generally, there are three sets of parameters that may be determined: first, the number of patterns; second, the weight for each scan chain (the content of weight selection registers); and third, the seed for reseeding logic, which is the initial value stored in the shift registers. The number of patterns can be chosen in a variety of ways, as is well-known in the art. One way is to define a basic unit of the number of patterns in each BIST session, and incrementing that unit until no more faults can be detected. As a result, the number of patterns in each BIST session can be varied in the hope to detect as many undetected faults as possible. The exemplary BIST flow starts in process block 110, where redundant faults are excluded from the fault list. Such a computation is accomplished using an automatic test pattern generator (ATPG). In process block 112, random patterns for a first BIST session are computed and the most easy-to-test faults are detected. In process block 114, fault simulation is used to update the fault list. In decision block 116, if the target fault coverage is achieved, the flow terminates (process block 118). If the target fault coverage is not achieved, then the method proceeds to process block 120 in order to implement weighted pattern testing with complementary weights from BIST session 1 to N. In process block 120, test generation is performed for the current BIST session being analyzed. In process block 122, the weight set is computed for the current BIST session. In process block 124, the weight for each scan chain and the seed value of the decompressor is then determined based on the computed weight set for the current BIST session. Once the content of the weight selection registers and shift registers are known, patterns for the BIST session can be computed. In process block 126, fault simulation is performed again and a number of patterns for the BIST session can be determined. This iteration continues until target fault coverage is achieved or the BIST session limit is reached as shown by arrow 128.

Figure 7:
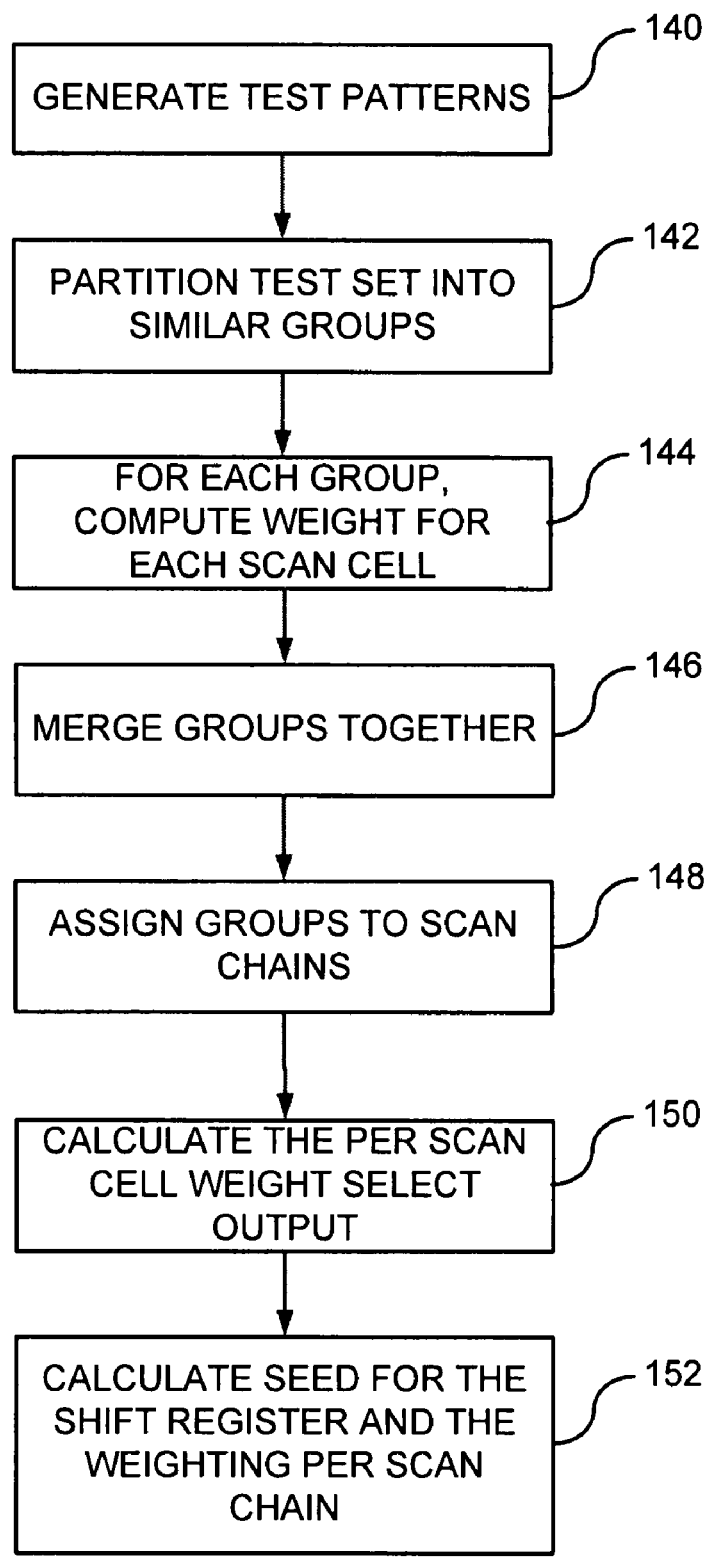
FIG. 7 is a flowchart of a method for calculating a seed value used in the BIST circuit.
Figure 8:
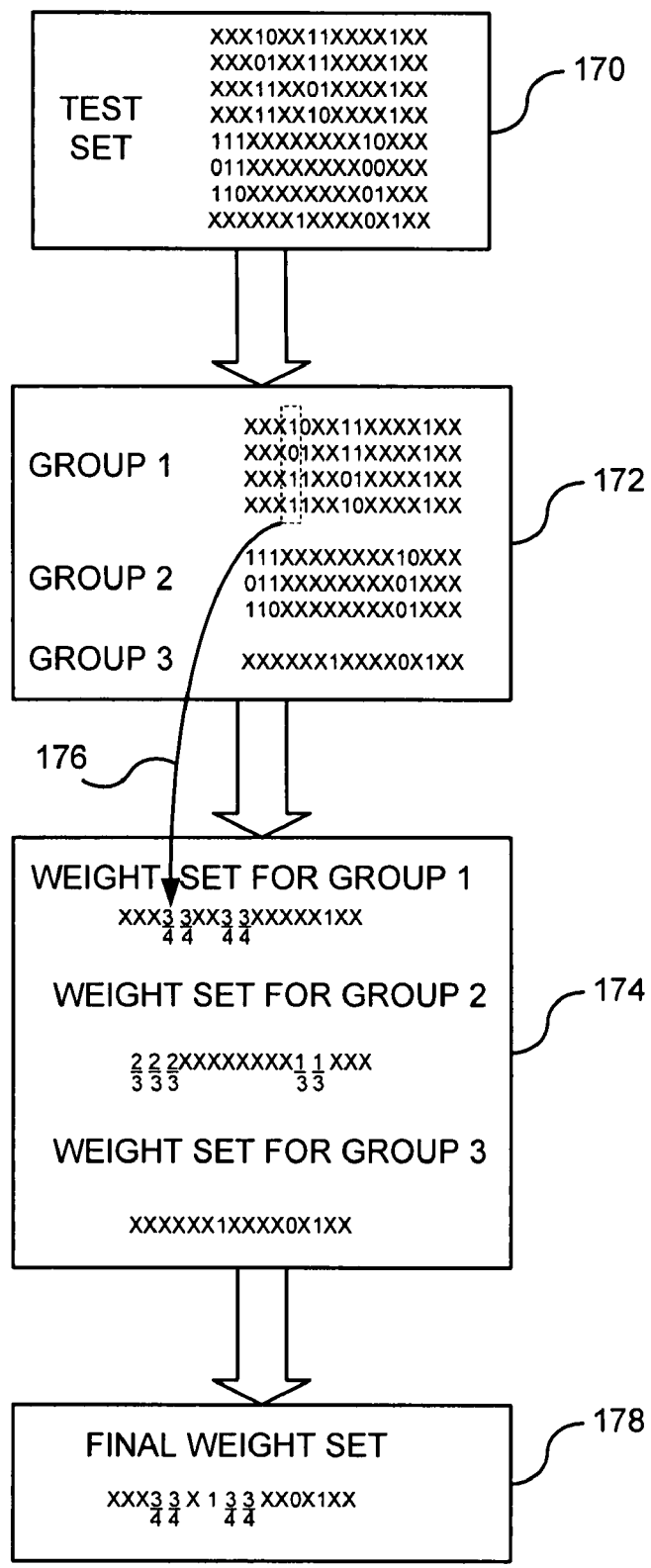
FIG. 8 is a detailed example using the method of FIG. 7.
Figure 9:
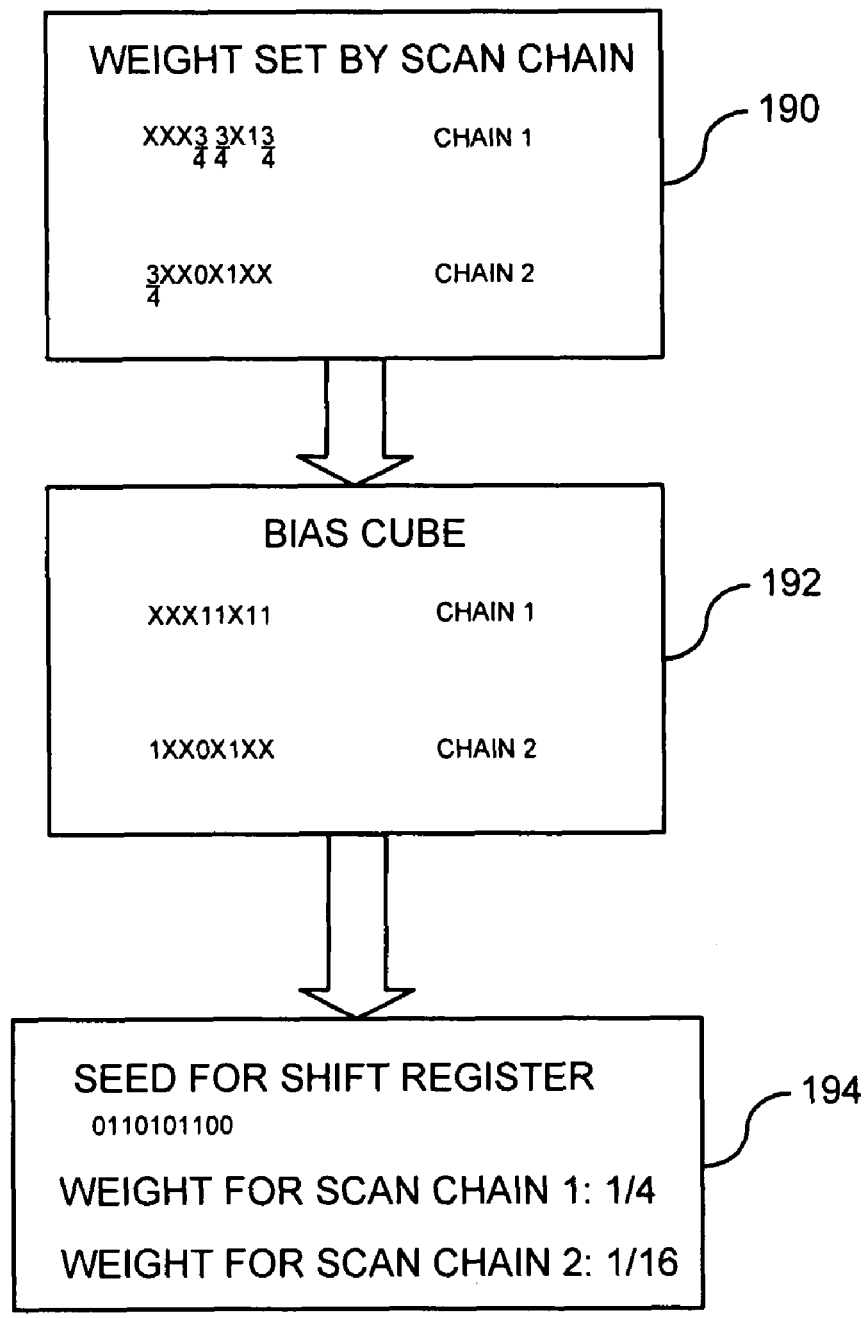
FIG. 9 is a continuation of the example of FIG. 8.

FIGS. 7, 8, and 9, provide further details and an example of how to compute the weight for a scan chain and the seed value for the shift registers. The example is for two scan chains with each scan chain having eight scan cells.

Starting with FIG. 7, process block 140 shows that the test patterns are first generated. Turning briefly to the example of FIG. 8, such a test pattern set is shown at 170, where the 1's and 0's are used to test the core logic and the X's are unspecified or "don't care" bits. It is desirable to leave as many unspecified bits as possible, because there is an intrinsic limitation on the care bit ratio that can be satisfied by any receiving logic. The test pattern set may be generated using a test generation tool using a target fault list. An ATPG can also be used by setting parameters, such as turning random fill off. In process block 142 (FIG. 7), the test sets are partitioned into similar groupings. For example, in FIG. 8, at 172, group 1 has four vectors that have similar don't care and similar care bits in terms of their positioning within the vector. Group 2 has vectors that are also very similar in terms of their bit positioning. Group 3 is different than any other vector and, consequently, only contains one vector. Returning to FIG. 7 in process block 144, the weight is computed for each scan cell in each group. For example, in FIG. 8, at 174, the weight set for each group is shown. A simple example is shown by arrow 176, where three of the four bits in Group 1 in a similar column have a value of 1 (logic high). Thus, the weight for that particular bit position is ¾ because the probability is 3 out of every 4 times the value in that group is a logic high. The weight sets for the rest of the groups are likewise computed. In process block 146, the groups are merged together. FIG. 8 shows, at 178, that the groups are merged together if they are compatible and not conflicting. Thus, at 178, Groups 1 and 3 are merged together because there are no conflicting scan cell or bit positions and the resultant group is below a desired number of bit positions having a specified weight. The weight set for Group 2 has some bit positions that conflict with Group 3. Additionally, if Groups 1 and 2 were merged, the specified bits in the weight set would exceed a specified limit. The specified limit may be any desired number. However, the total number of specified bits in the pattern should not exceed the capabilities of the decompressor. For a decompressor that is designed to operate at 10×, that is 10 scan chains for every channel, there is a theoretical ability to provide specific assignments for 10% of the scan cells. This implies that a design with very high compression may require more BIST sessions, since each session will have fewer specified bits. In process block 148, groups are assigned to scan chains. For example, in FIG. 9, at 190, the final weight set shown at 178 from FIG. 8 is simply divided into two parts, the first part for scan chain 1, and the second part for scan chain 2. In process block 150, the weight select output is calculated for each scan cell. As shown in FIG. 9, at 192, the weight select outputs assigned to scan chain 1 and scan chain 2 are shown with the values rounded to a binary value, instead of the fractional values that are used at 190. The transformation to obtain the seed and the weighting results in a bias cube, which is a test cube derived from the weight set. For a scan cell with a weight less than 0.5, a corresponding bit value of 0 is assumed. Likewise, scan cells with weights greater than 0.5 obtain the value of 1. An unknown value or X is asserted when the weight is unspecified or 0.5. Finally, at process block 152, the seed for the shift registers and the weighting per scan chain are calculated. These final results are shown at 194 in FIG. 9. Once the bias cube is known, it is fed into a reseeding solver to obtain the seed for the shift registers.

To determine the bias cube, assume weight p is used for scan chain 2. Since the bias cube for scan chain 2 is {1, x, x, 0, x, 1, x, x}, the corresponding complementary weight set for scan chain 2 would be {1−p, x, x, p, x, 1−p, x, x}. Square distance is computed for the complementary weight set and the original weight set for the scan chain. In this case, since the weight set for scan cells in chain 2 is {¾, x, x, 0, x, 1, x, x}, the square distance equals to $$\left(1 - p - \frac{3}{4}\right)^2 + p^2 + (1 - p - 1)^2.$$

Each scan chain can take in weight of ½, ¼, ⅛ and ¹⁄₁₆. The square distance is computed for each weight as suggested above. Let $S_p$ denote the square distance for weight p. Then $S_{1/2}$=0.5625, $S_{1/4}$=0.125, $S_{1/8}$=0.046875 and $S_{1/16}$=0.04296875. Since weight ¹⁄₁₆ has the minimum square distance, it is selected as the weight for the scan chain 2. Likewise, weight ¼ is selected for scan chain 1. Once the weight for each scan chain is defined, the content of weight selection register is determined accordingly. Thus, the bias cube determination is a form of averaging.

Figure 10:
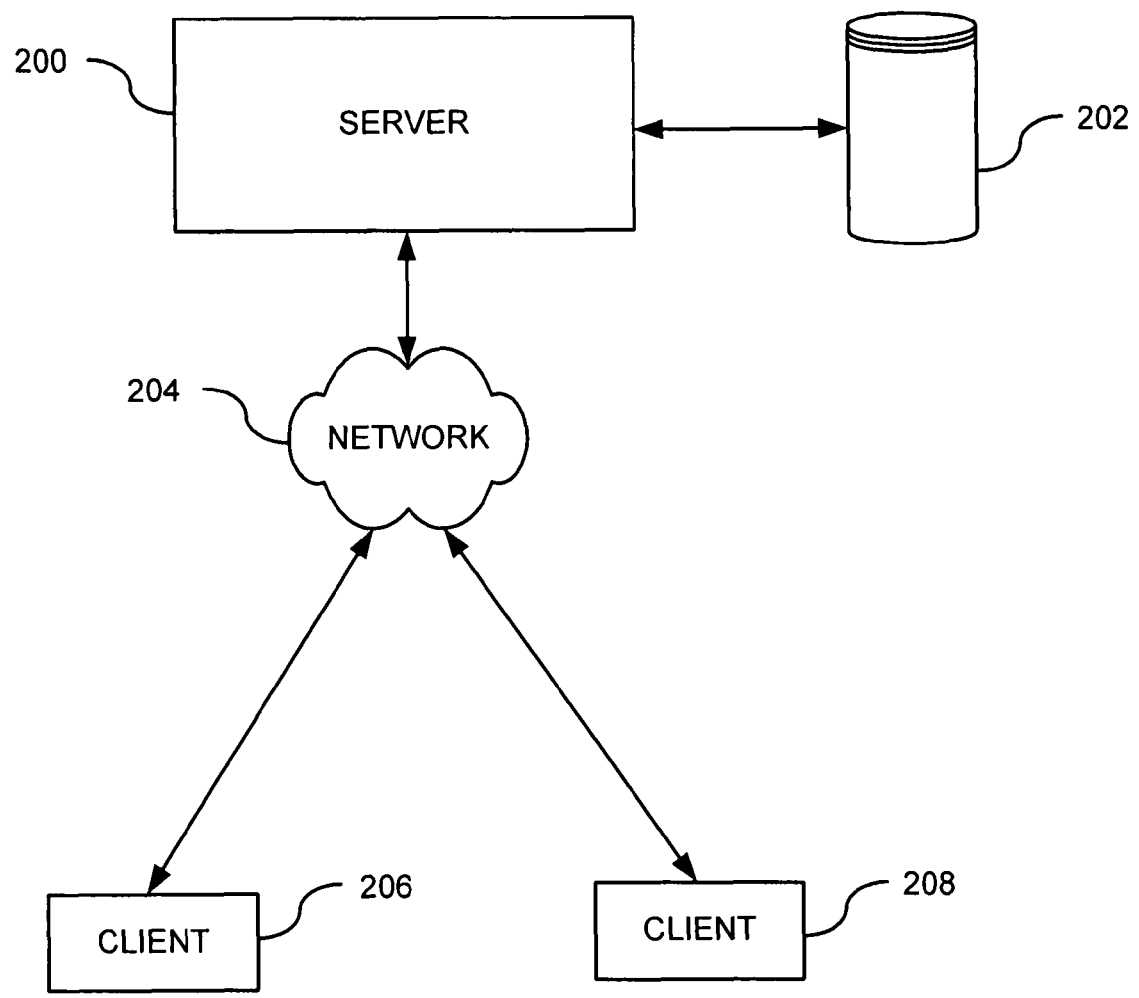
FIG. 10 is a schematic block diagram of a network used to perform any of the disclosed methods or to generate any of the circuits described herein.

Any of the aspects of the technology described above may be performed using a distributed computer network. FIG. 10 shows one suitable exemplary network. A server computer 200 can have an associated storage device 202 (internal or external to the server computer). For example, the server computer 200 can be configured to generate any of the disclosed embodiments, including circuits or methods for determining seed values. The server computer 200 can be coupled to a network, shown generally at 204, which can comprise, for example, a wide-area network, a local-area network, a client-server network, the Internet, or other suitable network. One or more client computers, such as those shown at 206, 208, may be coupled to the network 204 using a network protocol. The work may also be performed on a single, dedicated workstation, which has its own memory and one or more CPUs.

Figure 11:
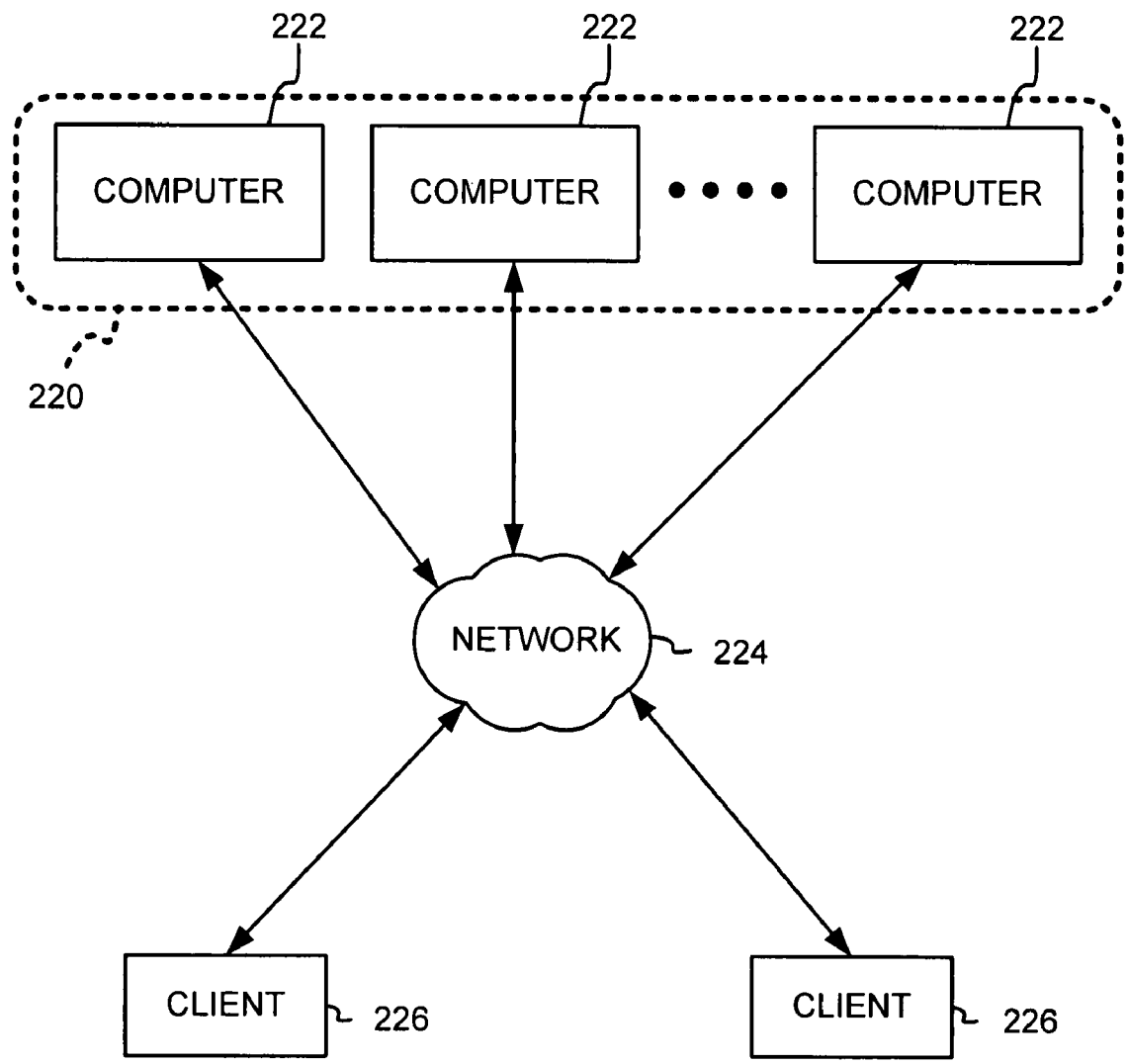
FIG. 11 is a schematic block diagram of a distributed computing network that may be used to perform many of the disclosed methods or to generate any of the circuitry described herein.

FIG. 11 shows another exemplary network. One or more computers 222 communicate via a network 224 and form a computing environment 220 (for example, a distributed computing environment). Each of the computers 222 in the computing environment can be used to design, simulate, or perform at least a portion of the circuits or methods disclosed herein. The network 224 in the illustrated embodiment is also coupled to one or more client computers 226.

Figure 12:
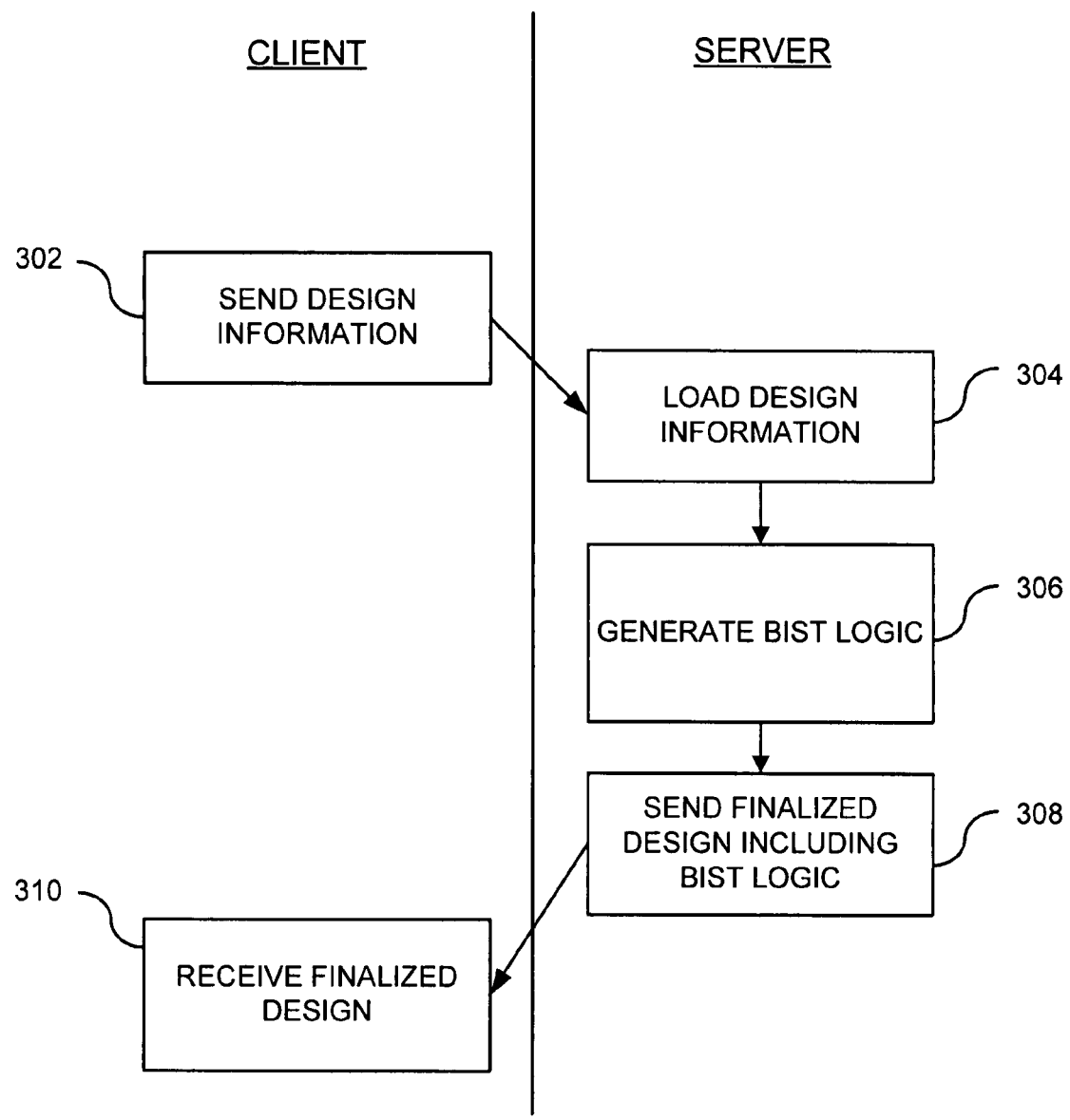
FIG. 12 is a flowchart of a method for generating the BIST circuit described herein using the networks of FIG. 10 or 11.

FIG. 12 shows that design information for a circuit-under-test (for example, an HDL file, netlist, GDSII file, Oasis file, or other suitable design file representing the circuit-under-test together with its testing circuitry) can be analyzed using a remote server computer (such as the server computer 200 shown in FIG. 10) or a remote computing environment (such as the computing environment 220 shown in FIG. 11) in order to generate a suitable circuit according to the disclosed technology. At process block 302, for example, the client computer sends the CUT design information to the remote server or computing environment. In process block 304, the CUT design information is received and loaded by the remote server or by respective components of the remote computing environment. In process block 306, on-chip test hardware generation is performed to produce design information for any of the disclosed embodiments. At process block 308, the remote server or computing environment sends the resulting design information (for example, an HDL file, netlist, GDSII file, Oasis file, or other suitable design file representing the circuit together with the circuit-under-test and scan chains) to the client computer, which receives the data at process block 310.

It should be apparent to those skilled in the art that the examples shown are not the only way to generate any of the disclosed hardware embodiments using multiple computers. For instance, the CUT design information may be stored on a computer-readable medium that is not on a network and that is sent separately to the server or computing environment (for example, a CD-ROM, DVD, or portable hard drive). Or, the server computer or remote computing environment may perform only a portion of the hardware design procedures.

Having illustrated and described the principles of the disclosed technology, it will be apparent to those skilled in the art that the disclosed embodiments can be modified in arrangement and detail without departing from such principles.

For example, some embodiments may use a single decompressed pattern to control multiple pseudo random patterns.

Still further, although two shift registers are shown feeding the decompressor, only a single shift register may be used. Conversely, more than two shift registers may be used.

The illustrated embodiments also contemplate the following numbered paragraphs:

1. An apparatus for performing built-in self-test on an integrated circuit, comprising: means for generating test patterns with complementary weights; means for selecting between the test patterns with the complementary weights; and means for storing the selected test pattern used for testing an integrated circuit.

2. That described in paragraph 1, further including means for compacting test results received from the scan chains.

3. That described in paragraph 1, wherein the means for selecting further includes means for shifting a predetermined pattern into a decompressor.

It is sometimes desirable to re-order the BIST sessions so that more effective sessions are applied earlier. For example, experiments have shown that it is possible to achieve approximately 90% to 95% coverage using only a few sessions.

A decompressor can also be designed to select between more than two weight options on a per-scan-cell basis. One method is to increase the size of the decompressor and the number of decompressor outputs. For a circuit with 100 internal scan chains, a decompressor may be used that is capable of driving 200 internal scan chains. Each real scan chain is controlled using two decompressor outputs. This provides the ability to select between four different weight values using two specified bits per scan cell.

Another alternative is to double the size of the shift register that feeds the decompressor, and generate two decompressor clock cycles for every scan shift cycle.

This also requires a "hold" register at every scan chain input. The multiplexer selection logic is driven using two consecutive bits of data from the decompressor.

As described herein, the decompressor translates a compressed pattern that is applied at primary input pins into scan chain contents. Compression is achieved by mapping the input pattern data to specific scan cells while loading the remaining cells with non-specified (arbitrary) values.

The types of decompressors may include the following:
(1) Decompressors based on Linear Finite State Machines (LFSM)
(2) Decompressors based on combinational networks (such as XOR gates or muxes)

LFSM-based decompressors can be based on continuous reseeding (wherein control data is fed directly into the LFSM at the start of each shift cycle), or other reseeding techniques such as using a shadow register (wherein control data transfers from the shadow register to the LFSM only at the first shift cycle, and the shadow register may be asynchronously or serially loaded).

Pure combinational network based decompressors directly map the control data to the scan chain inputs at the start of each shift cycle. (However, one should note that it is possible to add some memory elements inside the combinational network in order to improve efficiency).

In view of the many possible embodiments, it will be recognized that the illustrated embodiments include only examples and should not be taken as a limitation on the scope of the invention. Rather, the invention is defined by the following claims and their equivalents. We therefore claim as the invention all such embodiments and equivalents that come within the scope of these claims.

We claim:

1. A built-in self-test circuit within an integrated circuit, comprising:
    a plurality of scan chains for receiving test patterns;
    a pseudo random pattern generator coupled to the scan chains to provide test patterns of predetermined weights; and
    weight select logic, including a decompressor, coupled between the scan chains and the pseudo random pattern generator to control weightings of the test patterns that are loaded into the scan chains;
    the weight select logic further including at least one shift register within the integrated circuit, the decompressor including a ring generator with the at least one shift register having an output that is coupled as an input to the ring generator.

2. The built-in self-test circuit of claim 1, wherein the scan chains include a plurality of scan cells coupled in series and the weight select logic is configured to select different weightings of the test patterns on a per-scan-cell basis.

3. The built-in self-test circuit of claim 1, wherein the weight select logic is operable to select between a test pattern provided by the pseudo random pattern generator and the complement of that test pattern.

4. The built-in self-test circuit of claim 1, wherein the pseudo random pattern generator includes one or more of the following: a linear feedback shift register, a ring generator, or cellular automaton.

5. The built-in self-test circuit of claim 1, wherein the decompressor includes a phase shifter coupled to the ring generator.

6. The built-in self-test circuit of claim 1, wherein the decompressor includes a shadow register.

7. The built-in self-test circuit of claim 1, further including a test response compactor coupled to the output of the scan chains.

8. The built-in self-test circuit of claim 1, wherein the weight select logic includes combinational logic, the combinational logic having outputs coupled to the scan chains, a first set of inputs coupled to the decompressor and a second set of inputs coupled to the pseudo random pattern generator.

9. The built-in self-test circuit of claim 1, wherein the decompressor uses a compressed pattern and translates it into fixed bit assignments on selected scan cells while allowing other scan cells to have pseudo random assignments.

10. The built-in self-test circuit of claim 1, wherein the shift register is a first shift register and further including a second shift register coupled in parallel with the first shift register, with both the first and second shift register coupled to the decompressor; and
a plurality of Exclusive OR gates, each having a first input coupled to the decompressor and a second input coupled to the pseudo random pattern generator.

11. The built-in self-test circuit of claim 1, wherein the weight select logic controls weightings of the test patterns by selecting between test patterns or inverting test patterns.

12. The built-in self-test circuit of claim 1, wherein the weight select logic includes:
a plurality of multiplexers, each having a control input coupled to an output of the decompressor, a first input coupled to receive a first weighted test pattern generated by the pseudo random pattern generator, and a second input coupled to receive a second weighted test pattern.

13. A method of testing an integrated circuit using built-in self-test, the method comprising:
decompressing a compressed pattern using inputs from one or more shift registers having one or more inputs coupled to a ring generator within the decompressor;
generating a number of weighted pseudo random patterns; and
using the decompressed pattern to load fixed weight assignments into some scan cells of a scan chain and pseudo random weight assignments on other scan cells of the scan chain.

14. The method of claim 13, further including
wherein the fixed assignment represents a first weighted test pattern; and
during the loading of the scan chain, switching to a second weighted test pattern that is different than the first weighted test pattern.

15. The method of claim 14, wherein the first and second test patterns are complementary.

16. The method of claim 13, further including selecting between the fixed assignments and pseudo random assignments on a per-scan-cell basis as the scan chain is being loaded.

17. The method of claim 16, wherein selecting includes shifting a predetermined pattern of bits into a decompressor from a re-circulating shift register and decompressing the pattern of bits.

18. The method of claim 13, further including resetting a decompressor that performs the decompression and resetting a pseudo random pattern generator that generates the pseudo random patterns.

19. A method of generating a seed value for a built-in self-test circuit, the method comprising:
generating desired test patterns to be used in scan chains of the built-in self-test circuit;
partitioning the test patterns into groups;
computing a weighting on a scan-cell basis for each group;
merging the groups together to form a combined weight group; and
averaging the combined weight group to determine a seed value.

20. The method of claim 19, wherein averaging includes computing a square distance for each weight in the combined weight group.

21. The method of claim 19, wherein portions of the method are performed on a server computer in a network environment and portions of the method are performed on a client computer in the network environment.

22. A built-in self-test circuit used in testing an integrated circuit, comprising:
a plurality of scan chains;
a pseudo random pattern generator coupled to the scan chains to generate weighted pseudo random test patterns; and
a decompressor coupled to the pseudo random pattern generator to select which weighted pseudo random test patterns from the pattern generator are loaded into the scan chains;
wherein the decompressor includes a continuous-flow ring generator having at least one input coupled to a shift register within the integrated circuit.

23. The built-in self-test circuit of claim 22, wherein the pseudo random pattern generator includes a linear feedback shift register, a ring generator, or cellular automaton.

* * * * *